(12) United States Patent
McLeod et al.

(10) Patent No.: US 8,228,105 B2
(45) Date of Patent: Jul. 24, 2012

(54) CLOCK SIGNAL CORRECTION

(75) Inventors: Scott McLeod, Los Gatos, CA (US); Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 12/841,097

(22) Filed: Jul. 21, 2010

(65) Prior Publication Data

US 2012/0019299 A1   Jan. 26, 2012

(51) Int. Cl.
H03K 7/08   (2006.01)

(52) U.S. Cl. .......................... 327/175; 327/172

(58) Field of Classification Search .................... 327/175
See application file for complete search history.

(56) References Cited

U.S. PATENT DOCUMENTS

| | | | |
|---|---|---|---|
| 7,928,785 B2* | 4/2011 | Choi et al. | 327/175 |
| 2008/0150601 A1* | 6/2008 | Nonaka | 327/175 |
| 2008/0164926 A1* | 7/2008 | Choi | 327/175 |
| 2008/0191767 A1* | 8/2008 | Koo | 327/175 |
| 2012/0019299 A1* | 1/2012 | McLeod et al. | 327/175 |

* cited by examiner

*Primary Examiner* — Lincoln Donovan
*Assistant Examiner* — Ryan Jager
(74) *Attorney, Agent, or Firm* — Baker Botts L.L.P.

(57) ABSTRACT

In one embodiment, a method includes generating two or more clock signals, sequentially selecting each one of the clock signals, and adjusting the respective clock duty cycle of the selected one of the clock signals until it substantially matches a predetermined clock duty cycle. The adjustment of the respective clock duty cycle includes generating a control signal based on the respective clock duty cycle, generating a duty-cycle-distortion (DCD) correction signal based on the control signal, adjusting the respective clock duty cycle of the selected one of the clock signals based on the DCD correction signal, and adjusting the control and DCD correction signals and re-adjusting the respective clock duty cycle of the selected one of the clock signals until the respective clock duty cycle of the selected one of the clock signals substantially matches the predetermined clock duty cycle.

22 Claims, 5 Drawing Sheets

CLOCK SIGNAL CORRECTION

TECHNICAL FIELD

The present disclosure relates generally to correcting errors in clock signals.

BACKGROUND

Clock signals used in circuits may become corrupted by a multitude of causes and sources resulting in various errors or impairments in the clock signals. The corrupted clock signals may then introduce errors in circuits using the clock signals resulting in degraded circuit performance, errors in the outputs of the circuits, or rendering the circuits inoperable. As an example, corruption of a multi-phase clock signal may manifest as duty-cycle distortion (DCD) as well as skew between the phases of the clock signals constituting the multi-phase clock signal. Sources of corruption may include, for example, process mismatch, temperature fluctuations, differences between the wiring distances of the individual clock signals, improper transistor biasing, or other non-idealities. In particular, when a multi-phase clock must be routed across a significant chip distance or to a large load, it is generally difficult to ensure that the individual clock signals constituting the multi-phase clock arrive at the load with no DCD or skew. DCD and skew degrade circuit performance by reducing the timing margin of circuits that require accurately aligned clock phases. Furthermore, clock errors such as DCD and skew have a greater (more adverse) impact on circuit performance as the clock frequency increases, as a given amount of DCD or skew will occupy a greater fraction of the clock period.

DCD may be defined as the difference between the time duration of a clock signal's "high" pulse and the clock signal's "low" pulse for a given clock cycle. Ideally, and nominally, the high and low pulses have equal duration and hence the DCD is zero. A clock signal having high and low pulses of equal duration is said to have a 50 percent duty cycle. In contrast, a clock signal having high pulses of greater durations than its low pulses may be said to have a duty cycle greater than 50 percent while a clock signal having low pulses of greater durations than its high pulses may be said to have a duty cycle less than 50 percent.

Skew may be defined as the phase error in a desired phase offset (a desired phase offset of 0, 90, 180, or 270 degrees, for example) between two clock signals. As an example, the phase offset between each of the four constituent clock signals of a 4-phase quadrature clock should be 90 degrees; that is, a first one of the clock signals of the 4-phase quadrature clock is nominally taken to have zero degree phase, the second one of the clock signals of the 4-phase quadrature clock should have a 90 degree phase offset relative to the first one of the clock signals, the third one of the clock signals of the 4-phase quadrature clock should have a 90 degree phase offset relative to the second one of the clock signals (and hence a 180 degree phase offset relative to the first one of the clock signals), and the fourth one of the clock signals of the 4-phase quadrature clock should have a 90 degree phase offset relative to the third one of the clock signals (and hence a 270 degree phase offset relative to the first one of the clock signals). Similarly, the phase offset between the two clock signals of a 2-phase differential clock should be 180 degrees. Any discrepancy in these phase offsets is referred to as skew.

Thus, if the clock signal that must be corrected is, for example, a four-phase clock signal, potentially seven impairments may be required to be corrected: the DCD in each of the four constituent clock signals and the skew between each of the three clock signals of non-zero phase relative to the clock signal of nominal zero degree phase. Additionally, it is generally desirable to perform the correction using as few resources, particularly power and chip area, as possible.

DESCRIPTION OF EXAMPLE EMBODIMENTS

Particular embodiments relate to an electronic circuit, device, system, or method for correcting errors or impairments in periodic signals, and particularly clock signals. Particular embodiments more specifically relate to a circuit that receives a multi-phase clock signal that comprises two or more constituent clock signals of different respective phases and that corrects any DCD in each of the constituent clock signals as well as any phase skew between the constituent clock signals. Particular embodiments correct the DCD and phase skew of a multi-phase clock signal used in an integrated circuit chip while minimizing the power and chip area required to achieve such correction. Particular embodiments may be utilized in high speed circuits or communication systems (e.g., having clock frequencies at or exceeding 2.5, 5, or 10 GHz).

In the following description of example embodiments, particular embodiments are described with reference to an implementation that corrects the DCD and phase skew of a four-phase quadrature clock signal. However, other embodiments may be applicable in correcting DCD and phase skew in other multi-phase clock signals including differential clock signals, other clock signals, and periodic signals in general. Furthermore, as used herein, "or" may imply "and" as well as "or;" that is, "or" does not necessarily preclude "and," unless explicitly stated or implicitly implied.

Figure 1:
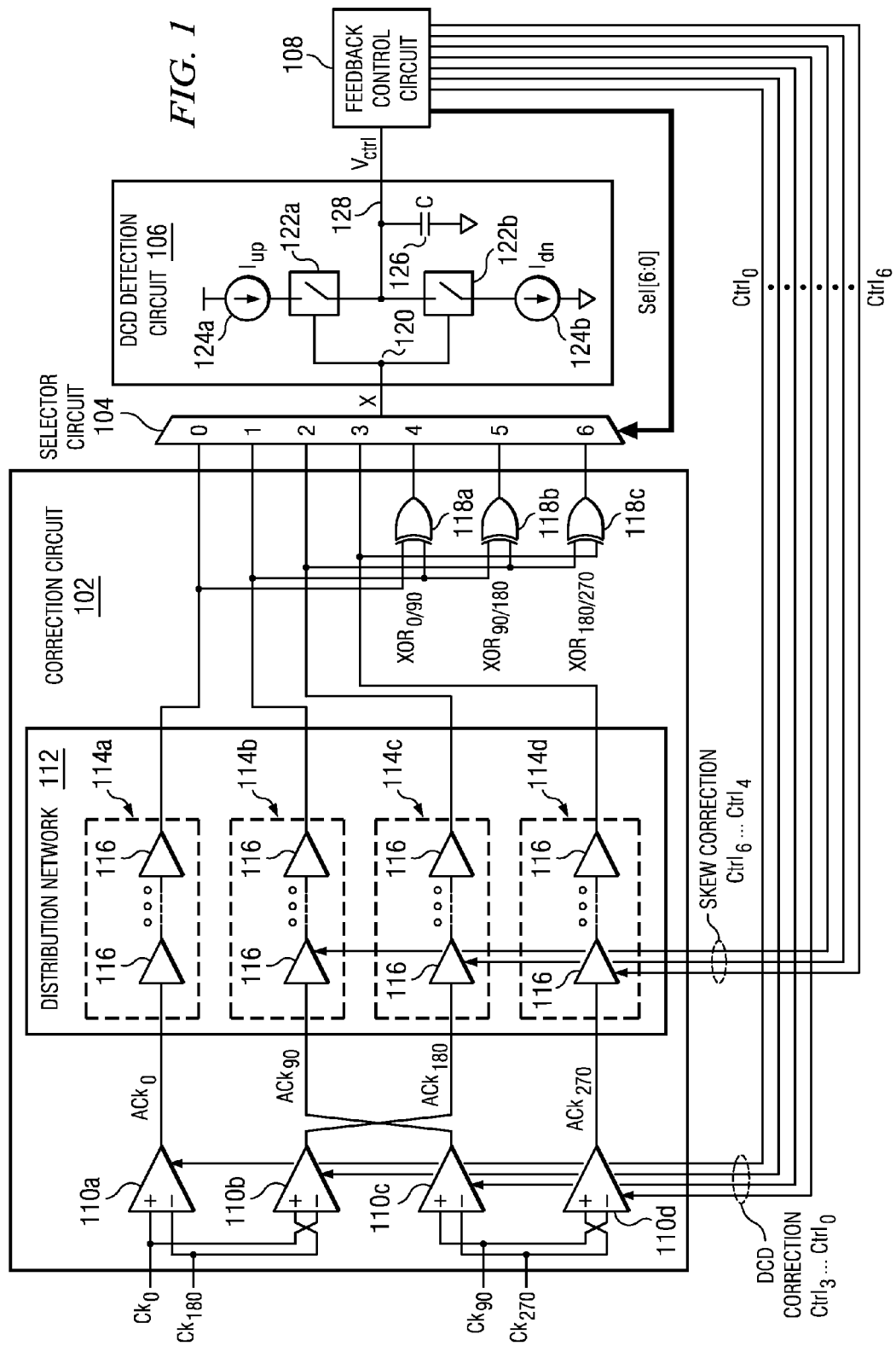
FIG. 1 illustrates an example circuit for correcting DCD and phase skew in two or more clock signals.

FIG. 1 illustrates an example system, device, or circuit 100 that comprises a correction circuit 102, a selector circuit 104, a DCD detection circuit 106, and a feedback control circuit 108. In particular embodiments, correction circuit 102 comprises a first comparator 110a, a second comparator 110b, a third comparator 110c, and a fourth comparator 110d. In particular embodiments, each of the comparators 110a-d are differential to single-ended amplifiers. In particular embodiments, correction circuit 102 further comprises a distribution network 112 that comprises a plurality of buffer circuits 114a, 114b, 114c, and 114d, each of which comprises one or more buffers 116. The comparators 110a-d may be connected with the distribution network 112 and buffer circuits 114a-d as shown in FIG. 1.

In the illustrated embodiment, the first comparator 110a receives as input a first clock signal $Ck_0$ having a clock frequency and a first nominal phase of zero degrees and a third clock signal $Ck_{180}$ having the same clock frequency and a third nominal phase of 180 degrees. The second comparator 110b receives as input the first clock signal $Ck_0$ and the third clock signal $Ck_{180}$ but to opposite input nodes of the second comparator 110b as compared with the first comparator 110a as shown in FIG. 1. The third operational amplifier 110c receives as input a second clock signal $Ck_{90}$ having the same clock frequency and a second nominal phase of 90 degrees and a fourth clock signal $Ck_{270}$ having the same clock frequency and a fourth nominal phase of 270 degrees. The fourth comparator 110d receives as input the second clock signal $Ck_{90}$ and the fourth clock signal $Ck_{270}$ but to opposite input nodes of the fourth comparator 110d as compared with the third comparator 110c as shown in FIG. 1. In the illustrated embodiment, the first comparator 110a, second comparator 110b, third comparator 110c, and fourth comparator 110d further receive DCD correction signals $Ctrl_0$, $Ctrl_1$, $Ctrl_2$, and $Ctrl_3$, respectively, and adjust the respective duty cycles of the first clock signal $Ck_0$, third clock signal $Ck_{180}$, second clock signal $Ck_{90}$, and fourth clock signal $Ck_{270}$, respectively, based on the DCD correction signals $Ctrl_0$, $Ctrl_1$, $Ctrl_2$, and $Ctrl_3$, respectively. The first comparator 110a, second comparator 110b, third comparator 110c, and fourth comparator 110d then output duty-cycle-adjusted first clock signal $ACk_0$, duty-cycle-adjusted third clock signal $ACk_{180}$, duty-cycle-adjusted second clock signal $ACk_{90}$, and duty-cycle-adjusted fourth clock signal $ACk_{270}$, respectively.

The adjusted first clock signal $ACk_0$, adjusted third clock signal $ACk_{180}$, adjusted second clock signal $ACk_{90}$, and adjusted fourth clock signal $ACk_{270}$, are then input to the distribution network 112 and corresponding buffer circuits 114a, 114b, 114c, and 114d, respectively. In particular embodiments, buffer circuits 114b, 114c, and 114d further receive as input phase skew correction signals $Ctrl_4$, $Ctrl_5$, and $Ctrl_6$, respectively, and adjust the buffering or delay of one or more of the adjusted second clock signal $ACk_{90}$, adjusted third clock signal $ACk_{180}$, and adjusted fourth clock signal $ACk_{270}$ relative to the first adjusted clock signal $ACk_0$ based on the phase correction signals $Ctrl_4$, $Ctrl_5$, and $Ctrl_6$, respectively, to adjust the respective phases of the adjusted second clock signal $ACk_{90}$, adjusted third clock signal $ACk_{180}$, and adjusted fourth clock signal $ACk_{270}$ relative to the phase of the first adjusted clock signal $ACk_0$. In one particular example embodiment, the phase skew correction signals $Ctrl_4$, $Ctrl_5$, and $Ctrl_6$ are generated (as described in detail below) so as to cause buffer circuits 114b, 114c, and 114d, respectively, to adjust the buffering of the adjusted clock signals $ACk_{90}$, $ACk_{180}$, and $ACk_{270}$, respectively, to effect an adjustment of the respective phases of the adjusted clock signals $ACk_{90}$, $ACk_{180}$, and $ACk_{270}$, respectively, such that their respective phases are offset 90 degrees, 180 degrees, and 270 degrees, respectively, relative to the first adjusted clock signal $ACk_0$. The adjusted clock signals $ACk_0$, $ACk_{90}$, $ACk_{180}$, and $ACk_{270}$, are then input to the selector circuit 104.

In particular embodiments, the first adjusted clock signal $ACk_0$ and second adjusted clock signal $ACk_{90}$ are also input to a first XOR logic gate 118a that outputs a first derived signal (also referred to herein as the first XOR signal) $XOR_{0|90}$ that, in particular embodiments, is the exclusive disjunction (XOR) of the first adjusted clock signal $ACk_0$ and second adjusted clock signal $ACk_{90}$. The second adjusted clock signal $ACk_{90}$ and third adjusted clock signal $ACk_{180}$ are also input to a second XOR logic gate 118b that outputs a second derived signal (also referred to herein as the second XOR signal) $XOR_{90|180}$ that, in particular embodiments, is the XOR of the second adjusted clock signal $ACk_{90}$ and third adjusted clock signal $ACk_{180}$. The third adjusted clock signal $ACk_{180}$ and fourth adjusted clock signal $ACk_{270}$ are also input to a third XOR logic gate 118c that outputs a third derived signal (also referred to herein as the third XOR signal) $XOR_{180|270}$ that, in particular embodiments, is the XOR of the third adjusted clock signal $ACk_{180}$ and fourth adjusted clock signal $ACk_{270}$. The first, second, and third XOR signals $XOR_{0|90}$, $XOR_{90|180}$, and $XOR_{180|270}$, respectively, are then also input to the selector circuit 104.

In particular embodiments, the selector circuit 104 is configured to sequentially select and output, one signal at a time, the first, second, third, and fourth adjusted clock signals $ACk_0$, $ACk_{90}$, $ACk_{180}$, and $ACk_{270}$, respectively, followed by the first, second, and third XOR signals $XOR_{0|90}$, $XOR_{90|180}$ and $XOR_{180|270}$, respectively, to the detection circuit 106. In particular embodiments, the detection circuit 106 comprises a single shared charge pump and loop filter circuit that comprises a single input node 120, a first switch 122a, a second switch 122b, a first current source 124a, a second current source 124b, a capacitor 126, and a single output node 128. Broadly, the detection circuit 106 is configured to sense any DCD in whatever one of the clock signals $ACk_0$, $ACk_{90}$, $ACk_{180}$, and $ACk_{270}$ or XOR signals $XOR_{0|90}$, $XOR_{90|180}$, and $XOR_{150|270}$, is selected and output by the selector circuit 104 and to communicate the sensed DCD to the feedback control circuit 108.

Figure 2:
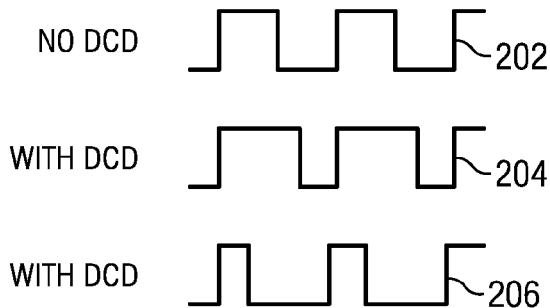
FIG. 2 illustrates DCD impairment in a clock signal.

As described above, each of the clock signals $Ck_0$, $Ck_{90}$, $Ck_{180}$, and $Ck_{270}$ may have DCD as well as skew. For didactic purposes, FIG. 2 illustrates a clock signal 202 having no DCD and hence, a duty cycle of 50 percent. FIG. 2 also illustrates a clock signal 204 having DCD such that the duty cycle of the clock signal 204 is greater than 50 percent. FIG. 2 further illustrates a clock signal 206 having DCD such that the duty cycle of the clock signal 206 is less than 50 percent.

Figure 3A:
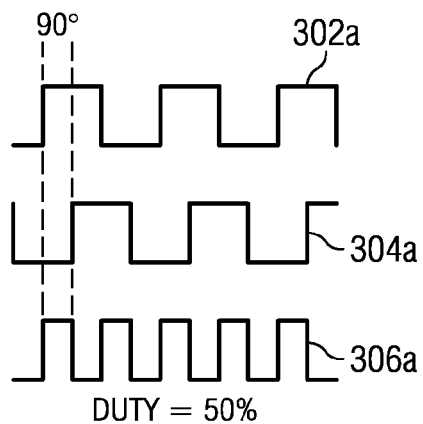
FIGS. 3A-3C illustrate the results of taking the XOR of two clock signals having no phase skew, having positive and negative phase skew, respectively.
Figure 3B:
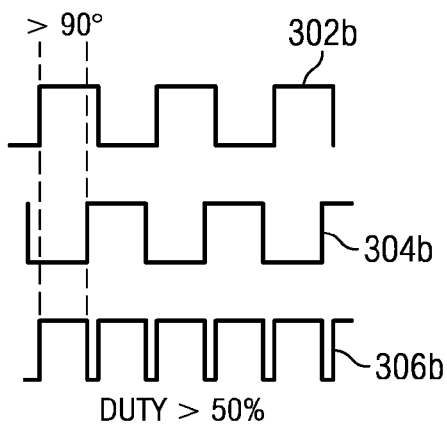
Figure 3C:
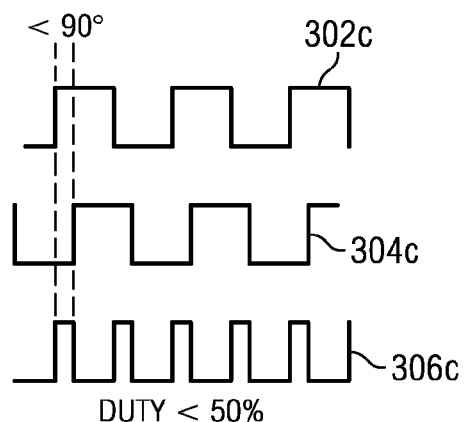

For didactic purposes, FIG. 3A illustrates a clock signal 302a having a nominal phase of zero degrees and a duty cycle of 50 percent, a clock signal 304a having a nominal phase of 90 degrees and a duty cycle of 50 percent, and a signal 306a that is the XOR of the clock signals 302a and 304a. In FIG. 3A, the clock signals 302a and 304a are not skewed relative to one another, and hence, the XOR signal 306a also has a duty cycle of 50 percent. FIG. 3B illustrates a clock signal 302b having a nominal phase of zero degrees and a duty cycle of 50 percent, a clock signal 304b having a nominal phase of 90 degrees (but an actual phase of greater than 90 degrees relative to clock signal 302b) and a duty cycle of 50 percent, and a signal 306b that is the XOR of the clock signals 302b and 304b. In FIG. 3B, clock signal 304b is skewed relative to clock signal 302b such that the phase offset between clock signal 304b and 302b is greater than 90 degrees, and hence, the XOR signal 306b has a duty cycle greater than 50 percent. FIG. 3C illustrates a clock signal 302c having a nominal phase of zero degrees and a duty cycle of 50 percent, a clock signal 304c having a nominal phase of 90 degrees (but an actual phase of less than 90 degrees relative to clock signal 302c) and a duty cycle of 50 percent, and a signal 306c that is the XOR of the clock signals 302c and 304c. In FIG. 3C, clock signal 304c is skewed relative to clock signal 302c such that the phase offset between clock signal 304c and 302c is less than 90 degrees, and hence, the XOR signal 306c has a duty cycle less than 50 percent.

Thus, in particular embodiments, by generating the XOR of two clock signals having phase skew, the phase skew between the two clock signals can be translated into DCD in the respective XOR signal. As described below, this allows the single DCD detection circuit 106 to detect both any DCD in the clock signals it receives, as well as any skew between the clock signals by way of detecting any DCD in the respective XOR signals. Moreover, by using a single DCD detection circuit, as opposed to a detection circuit for each of the signals, the required power and chip area are significantly reduced. As an example, the capacitor 126 that comprises the loop filter of the detection circuit 106 generally occupies a signification portion of chip (e.g., Silicon) area, and hence, by using a single detection circuit having a single charge pump and loop filter, significant chip area and power savings are realized. Indeed, as the number of clock phases whose impairments must be corrected grows, the advantages of using a single detection circuit comprising a single charge pump and loop filter become more pronounced.

In particular embodiments, whichever signal is selected and output by the selector circuit 104 is received at the input node 120 of the DCD detection circuit 106. In particular embodiments, the first switch 122a is configured to electrically connect the first current source 124a to the output node 128 when, and only when, the voltage of the selected signal is "high" (e.g., represents a logical "1"). When the first current source 124a is electrically connected to the output node 128, the first current source 124a raises the net charge on the capacitor 126 increasing the control voltage $V_{CTRL}$ on the output node 128. Similarly, the second switch 122b is configured to electrically connect the second current source 124b to the output node 128 when, and only when, the voltage of the selected signal is "low" (e.g., represents a logical "0"). When the second current source 124b is electrically connected to the output node 128, the second current source 124b lowers the net charge on the capacitor 126 decreasing the control voltage $V_{CTRL}$ on the output node 128.

In one example embodiment, the first switch 122a comprises a p-type metal-oxide-semiconductor field effect transistor (MOSFET) transistor (pmos transistor) and the second switch 122b comprises an n-type MOSFET transistor (nmos transistor). In one example embodiments, the signal selected and output by the selector circuit is input to the respective gates of the pmos and nmos transistors.

In particular embodiments, the control voltage $V_{CTRL}$ on the output node 128 of the detection circuit 106 is input to an input node of the feedback control circuit 108, which then generates correction signals $Ctrl_0$, $Ctrl_1$, $Ctrl_2$, $Ctrl_3$, $Ctrl_4$, $Ctrl_5$, and $Ctrl_6$, respectively, based on the control voltage $V_{CTRL}$ and on which of the clock signals $ACk_0$, $ACk_{90}$, $ACk_{180}$, and $ACk_{270}$ or XOR signals $XOR_{0|90}$, $XOR_{90|180}$, and $XOR_{180|270}$, respectively, is currently selected by the selector circuit 104. The correction signals $Ctrl_0$, $Ctrl_1$, $Ctrl_2$, $Ctrl_3$, $Ctrl_4$, $Ctrl_5$, and $Ctrl_6$, are input to the correction circuit 102 as described initially above.

In one example embodiment, the correction signals $Ctrl_0$, $Ctrl_1$, $Ctrl_2$, and $Ctrl_3$ are DCD correction signals that are input to the first comparator 110a, second comparator 110b, third comparator 110c, and fourth comparator 110d, respectively. Each of the first, second, third, and fourth comparators 110a-d is a block that converts a differential clock signal to a single-ended one based on a bias voltage of the respective one of the comparators. In one embodiment, the bias voltage of a given one of the first, second, third, and fourth comparators 110a-d is the respective one of the DCD correction signals $Ctrl_0$, $Ctrl_1$, $Ctrl_2$, and $Ctrl_3$ input to the respective one of the comparators. In another embodiment, the bias voltage of a given one of the first, second, third, and fourth comparators 110a-d is adjusted or based on the respective one of the DCD correction signals $Ctrl_0$, $Ctrl_1$, $Ctrl_2$, and $Ctrl_3$. For example, the first comparator 110a receives the first clock signal $Ck_0$ and the third clock signal $Ck_{180}$ and outputs the first clock signal $ACk_0$ with a duty cycle that is adjusted based on the DCD correction signal $Ctrl_0$.

In one example embodiment, the correction signals $Ctrl_4$, $Ctrl_5$, and $Ctrl_6$ are phase skew correction signals that are input to the second buffer circuit 114b, third buffer circuit 114c, and fourth buffer circuit 114d, respectively. In one embodiment, no phase skew correction signal is input to the first buffer circuit 114a as the first clock signal $ACk_0$ is assumed or taken to have a phase of zero degrees. In one embodiment, the second buffer circuit 114b, third buffer circuit 114c, and fourth buffer circuit 114d, adjust the buffering or delay of the second, third, and fourth clock signals $ACk_{90}$, $ACk_{180}$, and $ACk_{270}$, respectively, relative to the buffering of the first clock signal $ACk_0$ by using the phase skew corrections signals $Ctrl_4$, $Ctrl_5$, and $Ctrl_6$, respectively, to adjust the delay at one or more buffers 116 in each of the respective buffer circuits. As an example, if the phase difference between the first clock signal $Ck_0$ and the second clock signal $Ck_{90}$ is less than 90 degrees, the feedback action of the loop will increase the delay of the second clock signal $Ck_{90}$ via the phase skew correction signal $Ctrl_4$ until the XOR signal $XOR_{0|90}$ has a duty cycle of 50 percent, which indicates that the phase difference between the first clock signal $Ck_0$ and the second clock signal $Ck_{90}$ is 90 degrees.

In particular embodiments, the feedback control circuit 108 additionally outputs a 7-bit select signal Sel[6:0] that is input to selector circuit 104 and used to sequentially select and output each of the clock signals $ACk_0$, $ACk_{90}$, $ACk_{180}$, and $ACk_{270}$ or XOR signals $XOR_{0|90}$, $XOR_{90|180}$, and $XOR_{180|270}$ to the DCD detection circuit 106 starting with the first clock signal $ACk_0$. In particular embodiments, the selector circuit 108 only selects and outputs a single one of these signals (starting with the first clock signal $ACk_0$) based on the select signal Sel[6:0] until the feedback control circuit 108 changes the select signal Sel[6:0] to cause the selector circuit 104 to select and output the next signal. In particular embodiments, the feedback control circuit 108 only changes the select signal Sel[6:0] when the feedback control circuit 108 determines that the currently selected signal has a 50 percent duty cycle based on the control voltage $V_{CTRL}$ output by the detection circuit 106. In this way, by sequentially correcting the respective duty cycles of all four of the clock signals, the DCD of each of the clock signals will be zero. Then, by sequentially comparing (e.g., via XOR) the second clock signal $ACk_{90}$ with the first clock signal $ACk_0$ and correcting the skew between the second and first clock signals, comparing (e.g., via XOR) the third clock signal $ACk_{180}$ with the second clock signal $ACk_{90}$ and correcting the skew between the third and second clock signals, and comparing (e.g., via XOR) the fourth clock signal $ACk_{270}$ with the third clock signal $ACk_{180}$ and correcting the skew between the fourth and third clock signals, the phase skew between all four of the clock signals will also be zero.

Figure 4:
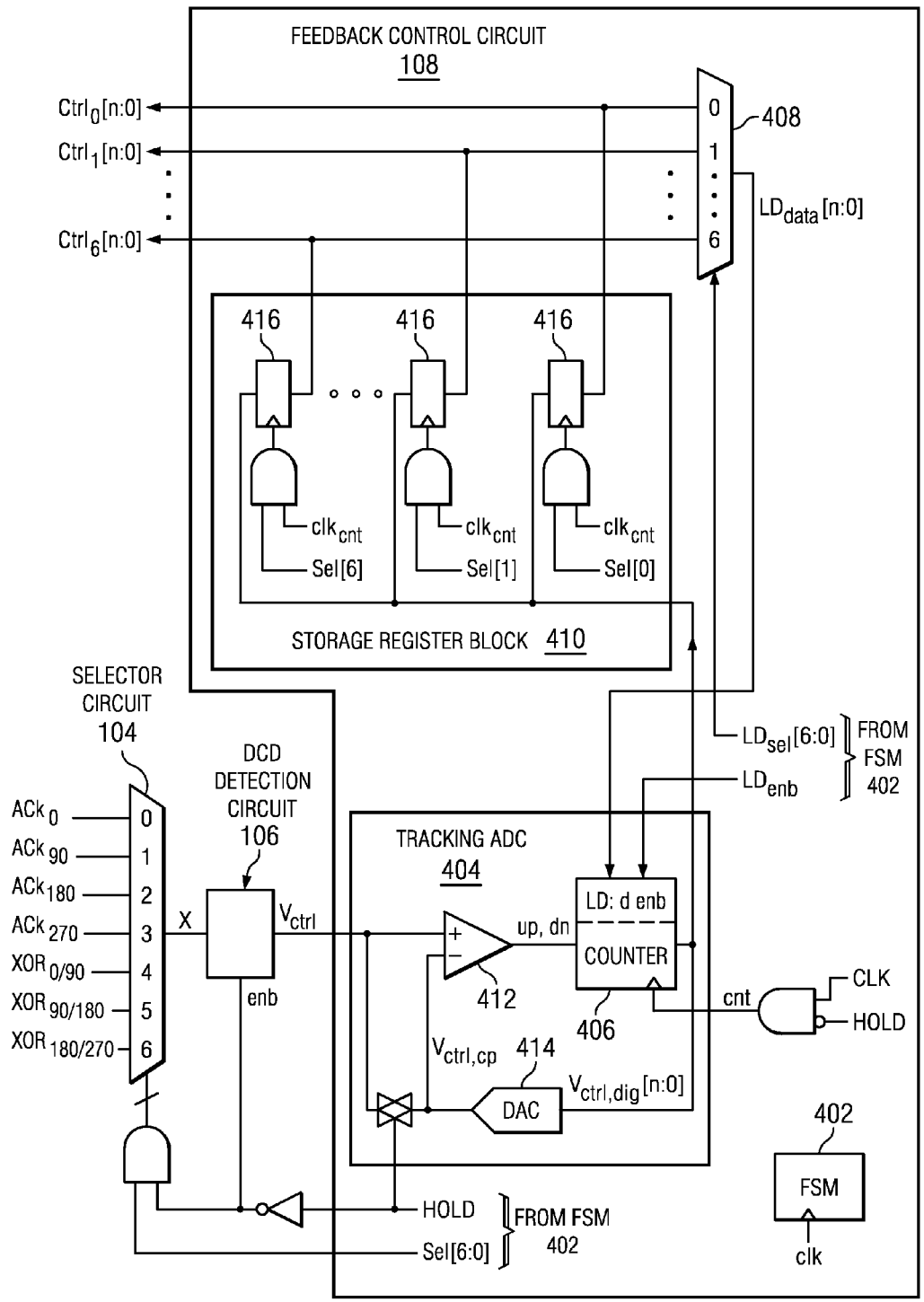
FIG. 4 illustrates an example feedback control circuit suitable for use in the circuit of FIG. 1.

FIG. 4 illustrates an example circuit implementation of an example feedback control circuit 108. The operation of the example feedback control circuit 108 illustrated in FIG. 4 is additionally described with reference to the example timing diagram illustrated in FIG. 5. In the embodiment illustrated in FIG. 4, signals that are multi-bit buses are indicated with a "[n:0]" suffix. In particular embodiments, feedback control circuit 108 comprises a finite state machine (FSM) 402 that switches between two modes of operation: "track" mode and "hold" mode. In particular embodiments, feedback control circuit 108 switches between the track and hold modes via two signals: the Sel[6:0] signal described above, and the "Hold" Signal.

In one particular embodiment, while in track mode, Hold is low (e.g., logical "0") and one bit of Sel[6:0] is high. In one embodiment, Sel[6:0] is a one-hot-encoded 7-bit bus. When Hold is low, the selector circuit 104 selects and outputs the signal indicated by the Sel[6:0] signal. Additionally, when Hold is low, the charge pump (comprising the switches 122a and 122b and the current sources 124a and 124b) is enabled, the transmission gate in the tracking analog-to-digital converter (ADC) 404 is high impedance (i.e., not conducting), and the clock signal $clk_{cnt}$ that triggers the counter 406 of ADC 404 is enabled. The counter 406 can be reset to a certain value by its load inputs ("LD"), d and enb. In track mode, however, the load-enable signal $LD_{enb}$, which is generated by FSM 402, is kept low. Thus, no data is loaded into the counter 406 during track mode, and the counter's output $V_{ctrl,dig}$ is instead controlled by the input signals up and dn.

In one particular embodiment, while in hold mode, FSM 402 raises Hold to high (e.g., logical "1"). When Hold is high, the selector circuit 104 does not pass (e.g., select and output) any of its inputs to the output of the selector circuit. Furthermore, while in hold mode, the charge pump is disabled, the transmission gate in the tracking ADC 404 is conducting, and the clock signal $clk_{cnt}$ that triggers the counter 406 is disabled. In one example embodiment, while in hold mode, one (or more) clock cycles prior to switching to track mode, FSM 402 raises $LD_{enb}$ for one clock cycle. This causes signal $LD_{data}$ to be loaded into counter 406 and, hence, $V_{ctrl,dig}$ to take on the value of $LD_{data}$. The value of $LD_{data}$ is controlled by signal $LD_{sel}$[6:0], which is also generated by FSM 402. A second selector circuit 408 then passes one of the correction signals $Ctrl_0$ (actually $Ctrl_0$[n:0]), $Ctrl_1$ (actually $Ctrl_1$[n:0]), $Ctrl_2$ (actually $Ctrl_2$[n:0]), $Ctrl_3$ (actually $Ctrl_3$[n:0]), $Ctrl_4$ (actually $Ctrl_4$[n:0]), $Ctrl_5$ (actually $Ctrl_5$[n:0]), and $Ctrl_6$ (actually $Ctrl_6$[n:0]), as specified by the value of $LD_{sel}$[6:0], output from storage register block 410 as $LD_{data}$[n:0].

As described above, during hold mode the charge pump is disabled and thus does not set the value of $V_{CTRL}$. Instead, because the transmission gate in ADC 404 is conducting while in hold mode, $V_{CTRL}$ is set by signal $V_{ctrl,cp}$ by charging the capacitor 126. Conversely, while in track mode, $V_{ctrl,cp}$ tracks the value of $V_{CTRL}$ and is thus a copy or replica of $V_{CTRL}$. In hold mode, however, $V_{ctrl,cp}$ is kept constant (because $clk_{cnt}$ is inhibited) until $LD_{enb}$ is raised to high and new data $LD_{data}$ is loaded into the counter 406.

Generally, in particular embodiments, the tracking ADC 404 is configured to make $V_{ctrl,cp}$ act as a copy of $V_{CTRL}$. In track mode, the control voltage $V_{CTRL}$ generated by the detection circuit 106 is tracked by the tracking ADC 404. In a particular embodiment, ADC 404 uses a feedback loop to force $V_{ctrl,cp}$ to track $V_{CTRL}$. As an example, in one embodiment, ADC 404 compares $V_{CTRL}$ against $V_{ctrl,cp}$ with a comparator 412. If $V_{ctrl,cp}$ differs from $V_{CTRL}$, the comparator 412 will raise either up or dn, causing the counter 406 to increment or decrement its count ($V_{ctrl,dig}$). The digital-to-analog converter (DAC) 414 converts $V_{ctrl,dig}$ to an analog value ($V_{ctrl,cp}$), which, in a particular embodiment, by virtue of the loop's feedback action will be set equal to $V_{CTRL}$. $V_{ctrl,cp}$ is thus a copy of $V_{CTRL}$ and $V_{ctrl,dig}$ is thus a digital representation of $V_{CTRL}$.

$V_{ctrl,dig}$ is also output to the (e.g., seven) storage registers 416 of storage register block 410 (one for each of the correction signals described above). Depending on which signal is currently being sensed by the detection circuit 106 (as determined by Sel[6:0]), one of the seven registers will latch $V_{ctrl,dig}$. This may be accomplished by gating the clock signal $clk_{cnt}$ that triggers each register with the appropriate Sel[i] signal. If, for example, Sel[2] is high (all the other Sel[i] signals of Sel[n:0] are low), only the register 416 for $Ctrl_2$ will be triggered. The outputs of the seven registers are fed back to the clock buffers in the manner shown in FIG. 1.

In hold mode, the clock $clk_{cnt}$ that triggers the counter 406 is inhibited and any assertions of up or dn are ignored. $V_{ctrl,dig}$ and $V_{ctrl,cp}$ therefore remain fixed during hold mode. Consequently, the storage registers store the final value of $V_{ctrl,dig}$ that was tracked during the previous track mode. In this manner, each of the correction signals $Ctrl_0$, $Ctrl_1$, $Ctrl_2$, $Ctrl_3$, $Ctrl_4$, $Ctrl_5$, and $Ctrl_6$ (generally referred to as $Ctrl_i$) responds to changes in $V_{CTRL}$ during the $i^{th}$ track mode but at its respective conclusion, remains fixed at the final value of $V_{ctrl,dig}$ for that respective track mode. $Ctrl_i$ then remains fixed at this value for the subsequent hold mode and the next, e.g., six (for the described embodiments for a four-phase clock signal), track-then-hold sequences.

In one particular embodiment, one (or more) clock cycles prior to switching to track mode, $LD_{enb}$ is asserted for one clock cycle. When $LD_{enb}$ is high, $LD_{data}$ is loaded into counter 406 and $V_{ctrl,dig}$ (and $V_{ctrl,cp}$) takes on this new value. Because the clock of the counter 406 is disabled, the counter continues to ignore the up and dn signals, and $V_{ctrl,dig}$ remains at the value of $LD_{data}$. Because the charge pump is also disabled, and $V_{CTRL}$ is controlled by $V_{ctrl,cp}$, $V_{CTRL}$ will be set to the value of $LD_{data}$. One clock cycle later, FSM 402 lowers $LD_{enb}$ and in that clock cycle (or after a number of clock cycles) switches to track mode. Upon entering track mode j, $V_{CTRL}$ will therefore be initialized to the value stored by the $j^{th}$ storage register 116 just as the charge pump is enabled and the selector circuit 104 selects and outputs the signal $j^{th}$ one of the signals $ACk_0$, $ACk_{90}$, $ACk_{180}$, and $ACk_{270}$ or XOR signals $XOR_{0|90}$, $XOR_{90|180}$, and $XOR_{150|270}$ to detection circuit 106. In particular embodiments, the rationale for loading the previously stored value of a particular signal j is to avoid making the loop reconverge if the final control voltage $V_{CTRL}$ value of the $j^{th}$ one of the signals $ACk_0$, $ACk_{90}$, $ACk_{180}$, and $ACk_{270}$ or XOR signals $XOR_{0|90}$, $XOR_{90|180}$, and $XOR_{180|270}$ differs from that of the $j-1^{th}$ one of the signals $ACk_0$, $ACk_{90}$, $ACk_{180}$, and $ACk_{270}$ or XOR signals $XOR_{0|90}$, $XOR_{90|180}$, and $XOR_{150|270}$.

Figure 5:
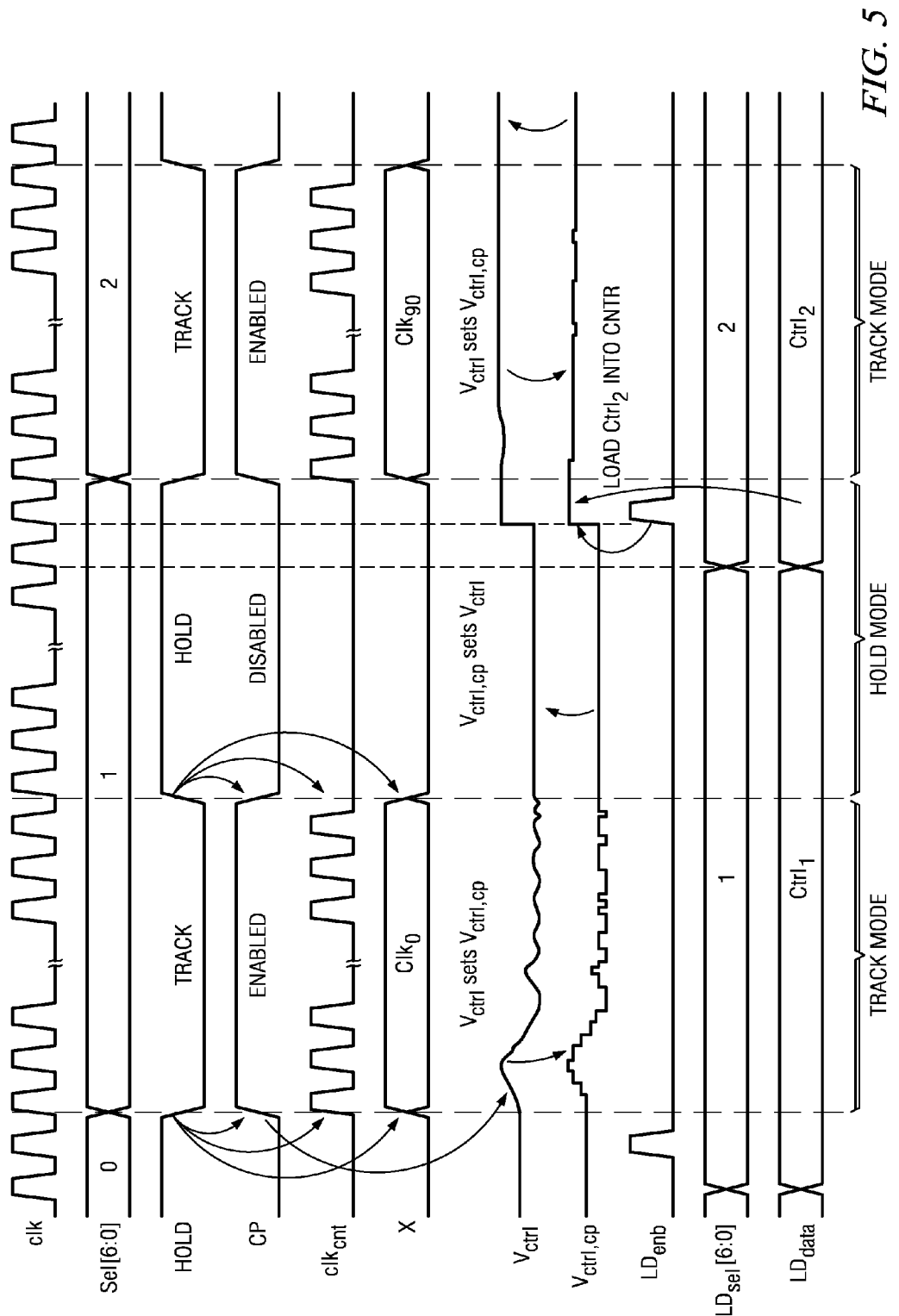
FIG. 5 illustrates an example timing diagram illustrating the operation of the feedback control circuit of FIG. 4.

FIG. 5 illustrates an example timing diagram for circuit 100 where "X" represents the signal selected and output by selector circuit 104. The two modes of operation, track and hold, are highlighted. As described above, in track mode, $V_{ctrl,cp}$ is controlled by $V_{CTRL}$, whereas in hold mode, $V_{CTRL}$ is controlled by $V_{ctrl,cp}$. As is also described above, and shown in FIG. 5, one (or more) clock cycles before the FSM 402 switches modes from hold to track (indicated by dashed lines 502), the ADC counter 406 is loaded with the value of $LD_{data}$, which, in the illustrated example, is being passed the value of $Ctrl_2$ via the selector circuit 104 (e.g., $LD_{sel}$[6:0]=0000100). Loading this new value into the counter 406 immediately propagates to $V_{ctrl,dig}$ (not shown) and, after a time sufficient to charge the capacitor 126, to $V_{ctrl,cp}$ (shown). Because the circuit 100 is currently in hold mode (in this example), this new value of $V_{ctrl,cp}$ is passed through the transmission gate to $V_{CTRL}$. Thus, one (or more) clock cycle prior to switching to track mode for selector input 2, the stored value of $Ctrl_2$ from selector input 2's previous track mode is loaded onto $V_{CTRL}$. In this manner, the feedback loops are initialized to their correct values when the circuit enters the track mode for this signal.

Figure 6:
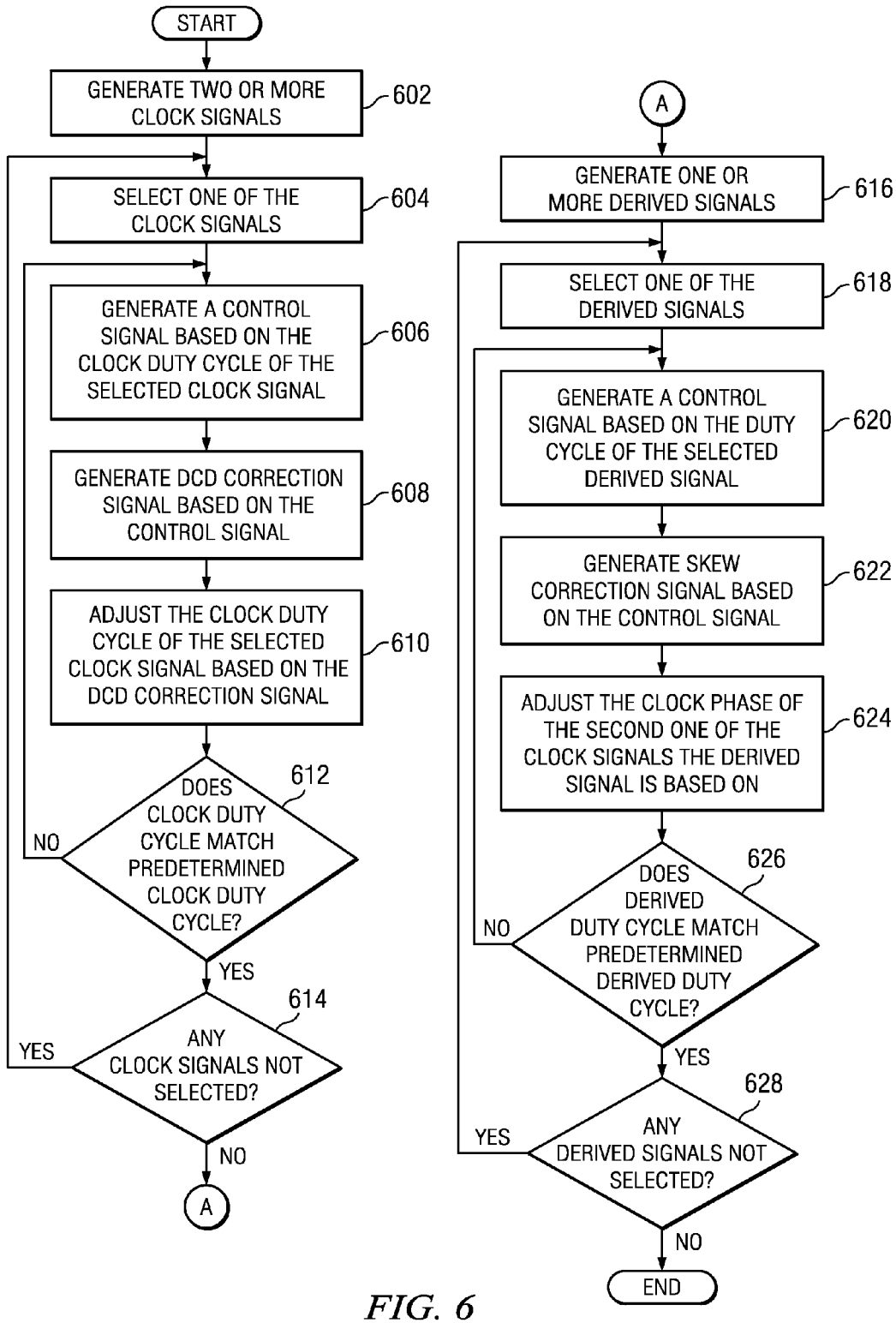
FIG. 6 illustrates a flowchart illustrating an example method for correcting DCD and phase skew in two or more clock signals.

FIG. 6 illustrates a flowchart illustrating an example method for correcting DCD and phase skew in two or more clock signals. In one embodiment, the method begins at 602 with generating two or more clock signals having a clock frequency, each of the clock signals having a respective clock phase and a respective clock duty cycle. The method proceeds with selecting, at 604, one of the clock signals. The respective clock duty cycle of the selected one of the clock signals is adjusted until it substantially matches a predetermined clock duty cycle. In a particular embodiment, the adjustment of the respective clock duty cycle of the selected one of the clock signals comprises: generating, at 606, a control signal based on the respective clock duty cycle of the selected one of the clock signals, generating, at 608, DCD correction signal based on the control signal, and adjusting, at 610, the respective clock duty cycle of the selected one of the clock signals based on the DCD correction signal. In particular embodiments, steps 606, 608, and 610 are repeated until it is determined, at 612, that the respective clock duty cycle of the selected one of the clock signals substantially matches the predetermined clock duty cycle. The method then proceeds with determining, at 614, whether there are any more clock signals that have not been selected. If there is another clock signal to be selected, the method proceeds at 604 with selecting the next clock signal.

In one embodiment, after adjusting all the respective clock duty cycles of all the clock signals until their respective clock duty cycles substantially match the predetermined duty cycle, the method proceeds at 616 with generating one or more derived signals, each of the derived signals being generated based on a corresponding pair of the clock signals and having a respective derived duty cycle. The method proceeds with selecting, at 618, each one of the derived signals. The respective derived duty cycle of the selected one of the derived signals is adjusted until it substantially matches a predetermined derived duty cycle. In a particular embodiment, the adjustment of the respective derived duty cycle of the selected one of the derived signals comprises: generating, at 620, a control signal based on the respective duty cycle of the selected one of the derived signals, generating, at 622, a skew correction signal based on the control signal, adjusting, at 624, based on the skew correction signal, the respective clock phase of a second one of the clock signals of the corresponding pair of clock signals that the selected one of the derived signals was generated based on. In particular embodiments, steps 620, 622, and 624 are repeated until it is determined, at 626, that the respective derived duty cycle of the selected one of the derived signals substantially matches the predetermined derived duty cycle, the predetermined derived duty cycle being set to make a respective phase offset of the respective clock phase of the second one of the clock signals of the corresponding pair of clock signals that the selected one of the derived signals was generated based on substantially match a predetermined phase offset relative to the respective clock phase of a first one of the clock signals of the corresponding pair of clock signals that the selected one of the clock signals was generated based on. The method then proceeds with determining, at 628, whether or not there are any more derived signals that have not been selected. If there is another derived signal to be selected, the method proceeds at 618 with selecting the next derived signal, otherwise, the method ends.

Although the present disclosure describes and illustrates particular steps of the method or process of FIG. 6 as occurring in a particular order, the present disclosure contemplates any suitable steps of the method of FIG. 6 occurring in any suitable order. Moreover, although the present disclosure describes and illustrates particular components carrying out particular steps of the method of FIG. 6, the present disclosure contemplates any suitable combination of any suitable components carrying out any suitable steps of the method of FIG. 6.

Particular embodiments offer particular advantages, one or more of which may include one or more of the following: reduced chip area, reduced power consumption, and reduced power-supply noise. As an example, because a detection circuit 106 comprising a single charge pump and loop filter is used, and because the circuitry of the feedback control circuit 108 is largely digital, they together occupy little chip area. As another example, dynamic power consumption of this circuit, device, or system is lower than that of other circuits, devices, or systems using multiple charge pumps and loop filters and/or that don't include some form of "hold" mode or state. This may be realized when the circuit 100 is quiescent for long durations, which can be achieved by making the duration of the hold mode larger, and maybe much larger, than that of the track mode. The relative durations of the hold and track modes can be chosen in this manner because, after an initial learning period after power-up (i.e., the first track mode for each of the DCD and skew impairments described above), each loop generally needs only to track temperature variations, which change relatively very slowly. Moreover, the duration of the track mode may be made relatively short by selecting the loop dynamics such that the loops converge quickly. As another example, since charge pumps cause switching noise, using only a single charge pump means that less switching noise will be generated by particular embodiments. Moreover, no switching noise is generated when the circuit is in hold mode because the charge pump is disabled. As another example, particular embodiments may operate at a higher frequency than other correction circuits because the correction circuitry is placed at the output of the distribution network rather than within the distribution network, and as such, doesn't load the nodes of the distribution network. Moreover, the distribution network can be built with a higher fanout ratio and thus built with fewer stages, further saving power and area. Additionally, because the correction circuitry is removed from within the distribution network, the power and area of particular embodiments are independent of the clock load as well as the clock frequency.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A method comprising:
   generating by a correction circuit two or more clock signals having a clock frequency, each of the clock signals having a respective clock phase and a respective clock duty cycle;
   sequentially selecting by a selector circuit each one of the clock signals; and
   adjusting the respective clock duty cycle of the selected one of the clock signals until it substantially matches a predetermined clock duty cycle, the adjustment of the respective clock duty cycle of the selected one of the clock signals comprising:
   generating by a detection circuit a control signal based on the respective clock duty cycle of the selected one of the clock signals;
   generating by a feedback control circuit a duty-cycle-distortion (DCD) correction signal based on the control signal;
   adjusting by the correction circuit the respective clock duty cycle of the selected one of the clock signals based on the DCD correction signal; and
   adjusting the control and DCD correction signals and re-adjusting the respective clock duty cycle of the selected one of the clock signals until the respective clock duty cycle of the selected one of the clock signals substantially matches the predetermined clock duty cycle.

2. The method of claim 1, further comprising, after adjusting all the respective clock duty cycles of all the clock signals until their respective clock duty cycles substantially match the predetermined duty cycle:

generating by the correction circuit one or more derived signals, each of the derived signals being generated based on a corresponding pair of the clock signals and having a respective derived duty cycle;

sequentially selecting by the selector circuit each one of the derived signals; and for each selected one of the derived signals, adjusting the respective derived duty cycle of the selected one of the derived signals until it substantially matches a predetermined derived duty cycle, the adjustment of the respective derived duty cycle of the selected one of the derived signals comprising:

generating by the detection circuit a control signal based on the respective derived duty cycle of the selected one of the derived signals;

generating by the feedback control circuit a skew correction signal based on the control signal;

based on the skew correction signal, adjusting by the correction circuit the respective clock phase of a second one of the clock signals of the corresponding pair of clock signals that the selected one of the derived signals was generated based on; and adjusting the control and skew correction signals and re-adjusting the respective clock phase of the second one of the clock signals of the corresponding pair of clock signals that the selected one of the derived signals was generated based on until the respective derived duty cycle of the selected one of the derived signals substantially matches the predetermined derived duty cycle, the predetermined derived duty cycle being set to make a respective phase offset of the respective clock phase of the second one of the clock signals of the corresponding pair of clock signals that the selected one of the derived signals was generated based on substantially match a predetermined phase offset relative to the respective clock phase of a first one of the clock signals of the corresponding pair of clock signals that the selected one of the clock signals was generated based on.

3. The method of claim 2, wherein the clock signals comprise:

a first clock signal having the clock frequency, a first clock phase, and a first clock duty cycle;

a second clock signal having the clock frequency, a second clock phase, and a second clock duty cycle;

a third clock signal having the clock frequency, a third clock phase, and a third clock duty cycle;

a fourth clock signal having the clock frequency, a fourth clock phase, and a fourth clock duty cycle.

4. The method of claim 3, wherein the derived signals comprise:

a first XOR signal that is the exclusive disjunction (XOR) of the first and second clock signals, the first XOR signal having a first derived duty cycle;

a second XOR signal that is the exclusive disjunction (XOR) of the second and third clock signals, the second XOR signal having a second derived duty cycle; and a third XOR signal that is the exclusive disjunction (XOR) of the third and fourth clock signals, the third XOR signal having a third derived duty cycle.

5. The method of claim 4, wherein:

the predetermined clock duty cycle is a 50 percent duty cycle;

the predetermined derived duty cycle is a 50 percent duty cycle; and the predetermined phase offset is a 90 degree phase offset.

6. The method of claim 5, wherein:

the feedback control circuit comprises:

an input node that receives whatever control signal is generated by the detection circuit; and the detection circuit comprises:

an input node that receives the selected one of the clock signals or the selected one of the derived signals currently selected by the selector circuit;

an output node electrically connected to the input node of the feedback control circuit;

a first current source configured to raise the voltage on the output node of the detection circuit thereby raising the voltage of the control signal on the input node of the feedback control circuit;

a second current source configured to lower the voltage on the output node of the detection circuit thereby lowering the voltage of the control signal on the input node of the feedback control circuit;

a first switch that electrically connects the first current source to the output node when and only when the signal selected by the selector is high; and a second switch that electrically connects the second current source to the output node when and only when the signal selected by the selector is low.

7. The method of claim 6, wherein:

the feedback control circuit further comprises:

a first output node that outputs a first DCD correction signal when the first clock signal is selected by the selector circuit and received by the detection circuit;

a second output node that outputs a second DCD correction signal when the second clock signal is selected by the selector circuit and received by the detection circuit;

a third output node that outputs a third DCD correction signal when the third clock signal is selected by the selector circuit and received by the detection circuit;

a fourth output node that outputs a fourth DCD correction signal when the fourth clock signal is selected by the selector circuit and received by the detection circuit;

a fifth output node that outputs a first skew correction signal when the first XOR signal is selected by the selector circuit and received by the detection circuit;

a sixth output node that outputs a second skew correction signal when the second XOR signal is selected by the selector circuit and received by the detection circuit; and a seventh output node that outputs a third skew correction signal when the third XOR signal is selected by the selector circuit and received by the detection circuit.

8. The method of claim 7, wherein:

the correction circuit comprises:

a first differential to single-ended comparator circuit configured to receive the first DCD correction signal and to adjust the clock duty cycle of the first clock signal based on the first DCD correction signal;

a second differential to single-ended comparator circuit configured to receive the second DCD correction signal and to adjust the clock duty cycle of the third clock signal based on the second DCD correction signal;

a third differential to single-ended comparator circuit configured to receive the third DCD correction signal and to adjust the clock duty cycle of the second clock signal based on the third DCD correction signal;

a fourth differential to single-ended comparator circuit configured to receive the fourth DCD correction signal and to adjust the clock duty cycle of the fourth clock signal based on the fourth DCD correction signal;

a first delay buffer circuit configured to receive the first clock signal generated by the first differential to single-ended comparator and to output the first clock signal to the selector circuit;

a second delay buffer circuit configured to:
  receive the second clock signal generated by the third differential to single-ended comparator;
  receive the first skew correction signal;
  adjust a delay of the second clock signal to adjust the phase of the second clock signal based on the first skew correction signal; and
  output the second clock signal to the selector circuit;

a third delay buffer circuit configured to:
  receive the third clock signal generated by the second differential to single-ended comparator;
  receive the second skew correction signal;
  adjust a delay of the third clock signal to adjust the phase of the third clock signal based on the second skew correction signal; and
  output the third clock signal to the selector circuit; and a fourth delay buffer circuit configured to:
  receive the fourth clock signal generated by the fourth differential to single-ended comparator;
  receive the third skew correction signal;
  adjust a delay of the fourth clock signal to adjust the phase of the fourth clock signal based on the third skew correction signal; and
  output the fourth clock signal to the selector circuit;

adjusting by the correction circuit the respective clock duty cycle of the selected one of the clock signals based on the DCD correction signal comprises inputting the respective DCD correction signal to the corresponding one of the differential to single-ended comparator circuits to adjust a bias voltage of the differential to single-ended comparator circuit to adjust the respective clock duty cycle of the selected one of the clock signals; and adjusting by the correction circuit the respective clock phase of the second one of the clock signals of the corresponding pair of clock signals that the selected one of the derived signals was generated based on comprises inputting the respective skew correction signal to the corresponding delay buffer circuit to adjust a delay of the second one of the clock signals of the corresponding pair of clock signals that the selected one of the derived signals was generated based on thereby adjusting the phase of the second one of the clocks signals.

9. The method of claim 8, wherein after adjusting all the respective clock duty cycles of all the clock signals until their respective clock duty cycles substantially match the predetermined clock duty cycle and after adjusting all the respective derived duty cycles of all the derived signals until their respective derived duty cycles substantially match the predetermined derived duty cycle:

the phase offset between the second clock signal and the first clock signal is a 90 degree phase offset such that the phase of the second clock signal is offset 90 degrees relative to the phase of the first clock signal;

the phase offset between the third clock signal and the second clock signal is a 90 degree phase offset such that the phase of the third clock signal is offset 90 degrees relative to the phase of the second clock signal such that the phase of the third clock signal is offset 180 degrees relative to the phase of the first clock signal;

the phase offset between the fourth clock signal and the third clock signal is a 90 degree phase offset such that the phase of the fourth clock signal is offset 90 degrees relative to the phase of the third clock signal such that the phase of the fourth clock signal is offset 270 degrees relative to the phase of the first clock signal.

10. A method comprising:

receiving by a correction circuit two or more clock signals having a clock frequency, each of the clock signals having a respective clock phase;

generating by the correction circuit one or more derived signals, each of the derived signals being generated based on a corresponding pair of the clock signals and having a respective duty cycle;

sequentially selecting by a selector circuit each one of the derived signals;

adjusting the respective duty cycle of the selected one of the derived signals until it substantially matches a predetermined duty cycle, the adjustment of the respective duty cycle of the selected one of the derived signals comprising:
  generating by the detection circuit a control signal based on the respective duty cycle of the selected one of the derived signals;
  generating by the feedback control circuit a skew correction signal based on the control signal;
  based on the skew correction signal, adjusting by the correction circuit the respective clock phase of a second one of the clock signals of the corresponding pair of clock signals that the selected one of the derived signals was generated based on; and
  adjusting the control and skew correction signals and re-adjusting the respective clock phase of the second one of the clock signals of the corresponding pair of clock signals that the selected one of the derived signals was generated based on until the respective duty cycle of the selected one of the derived signals substantially matches the predetermined duty cycle, the predetermined duty cycle being set to make a respective phase offset of the respective clock phase of the second one of the clock signals of the corresponding pair of clock signals that the selected one of the derived signals was generated based on substantially match a predetermined phase offset relative to the respective clock phase of a first one of the clock signals of the corresponding pair of clock signals that the selected one of the clock signals was generated based on.

11. The method of claim 10, wherein each one of the derived signals is an XOR signal that is the exclusive disjunction (XOR) of the first and second ones of the clock signals of the corresponding pair of clock signals that the respective one of the derived signals was generated based on.

12. A circuit comprising:

a correction circuit configured to generate two or more clock signals having a clock frequency, each of the clock signals having a respective clock phase and a respective clock duty cycle;

a selector circuit configured to sequentially selecting each one of the clock signals;

a detection circuit configured to generate a control signal based on the respective clock duty cycle of the selected one of the clock signals;
a feedback control circuit configured to generate a duty-cycle-distortion (DCD) correction signal based on the control signal;
wherein:
the correction circuit is configured to adjust the respective clock duty cycle of the selected one of the clock signals based on the DCD correction signal; and
the detection circuit, the feedback control circuit, and the correction circuit are configured to adjust the control signal, adjust the DCD correction signal, and re-adjust the respective clock duty cycle of the selected one of the clock signals until the respective clock duty cycle of the selected one of the clock signals substantially matches a predetermined clock duty cycle.

13. The circuit of claim 12, wherein after adjusting all the respective clock duty cycles of all the clock signals until their respective clock duty cycles substantially match the predetermined duty cycle:
the correction circuit is configured to generate one or more derived signals, each of the derived signals being generated based on a corresponding pair of the clock signals and having a respective derived duty cycle;
the selector circuit is configured to sequentially select each one of the derived signals; and
for each selected one of the derived signals:
the detection circuit is configured to generate a control signal based on the respective derived duty cycle of the selected one of the derived signals;
the feedback control circuit is configured to generate a skew correction signal based on the control signal;
wherein:
the correction circuit is configured to, based on the skew correction signal, adjust the respective clock phase of a second one of the clock signals of the corresponding pair of clock signals that the selected one of the derived signals was generated based on; and
the detection circuit, the feedback control circuit, and the correction circuit are configured to adjust the control and skew correction signals and re-adjust the respective clock phase of the second one of the clock signals of the corresponding pair of clock signals that the selected one of the derived signals was generated based on until the respective derived duty cycle of the selected one of the derived signals substantially matches the predetermined derived duty cycle, the predetermined derived duty cycle being set to make a respective phase offset of the respective clock phase of the second one of the clock signals of the corresponding pair of clock signals that the selected one of the derived signals was generated based on substantially match a predetermined phase offset relative to the respective clock phase of a first one of the clock signals of the corresponding pair of clock signals that the selected one of the clock signals was generated based on.

14. The circuit of claim 13, wherein the clock signals comprise:
a first clock signal having the clock frequency, a first clock phase, and a first clock duty cycle;
a second clock signal having the clock frequency, a second clock phase, and a second clock duty cycle;
a third clock signal having the clock frequency, a third clock phase, and a third clock duty cycle;
a fourth clock signal having the clock frequency, a fourth clock phase, and a fourth clock duty cycle.

15. The circuit of claim 14, wherein the derived signals comprise:
a first XOR signal that is the exclusive disjunction (XOR) of the first and second clock signals, the first XOR signal having a first derived duty cycle;
a second XOR signal that is the exclusive disjunction (XOR) of the second and third clock signals, the second XOR signal having a second derived duty cycle; and
a third XOR signal that is the exclusive disjunction (XOR) of the third and fourth clock signals, the third XOR signal having a third derived duty cycle.

16. The circuit of claim 15, wherein:
the predetermined clock duty cycle is a 50 percent duty cycle;
the predetermined derived duty cycle is a 50 percent duty cycle; and
the predetermined phase offset is a 90 degree phase offset.

17. The circuit of claim 16, wherein:
the feedback control circuit comprises:
an input node that receives whatever control signal is generated by the detection circuit; and
the detection circuit comprises:
an input node that receives the selected one of the clock signals or the selected one of the derived signals currently selected by the selector circuit;
an output node electrically connected to the input node of the feedback control circuit;
a first current source configured to raise the voltage on the output node of the detection circuit thereby raising the voltage of the control signal on the input node of the feedback control circuit;
a second current source configured to lower the voltage on the output node of the detection circuit thereby lowering the voltage of the control signal on the input node of the feedback control circuit;
a first switch that electrically connects the first current source to the output node when and only when the signal selected by the selector is high; and
a second switch that electrically connects the second current source to the output node when and only when the signal selected by the selector is low.

18. The circuit of claim 17, wherein:
the feedback control circuit further comprises:
a first output node that outputs a first DCD correction signal when the first clock signal is selected by the selector circuit and received by the detection circuit;
a second output node that outputs a second DCD correction signal when the second clock signal is selected by the selector circuit and received by the detection circuit;
a third output node that outputs a third DCD correction signal when the third clock signal is selected by the selector circuit and received by the detection circuit;
a fourth output node that outputs a fourth DCD correction signal when the fourth clock signal is selected by the selector circuit and received by the detection circuit;
a fifth output node that outputs a first skew correction signal when the first XOR signal is selected by the selector circuit and received by the detection circuit;

a sixth output node that outputs a second skew correction signal when the second XOR signal is selected by the selector circuit and received by the detection circuit; and a seventh output node that outputs a third skew correction signal when the third XOR signal is selected by the selector circuit and received by the detection circuit.

19. The circuit of claim 18, wherein:
the correction circuit comprises:
a first differential to single-ended comparator circuit configured to receive the first DCD correction signal and to adjust the clock duty cycle of the first clock signal based on the first DCD correction signal;
a second differential to single-ended comparator circuit configured to receive the second DCD correction signal and to adjust the clock duty cycle of the third clock signal based on the second DCD correction signal;
a third differential to single-ended comparator circuit configured to receive the third DCD correction signal and to adjust the clock duty cycle of the second clock signal based on the third DCD correction signal;
a fourth differential to single-ended comparator circuit configured to receive the fourth DCD correction signal and to adjust the clock duty cycle of the fourth clock signal based on the fourth DCD correction signal;
a first delay buffer circuit configured to receive the first clock signal generated by the first differential to single-ended comparator and to output the first clock signal to the selector circuit;
a second delay buffer circuit configured to:
receive the second clock signal generated by the third differential to single-ended comparator;
receive the first skew correction signal;
adjust a delay of the second clock signal to adjust the phase of the second clock signal based on the first skew correction signal; and
output the second clock signal to the selector circuit;
a third delay buffer circuit configured to:
receive the third clock signal generated by the second differential to single-ended comparator;
receive the second skew correction signal;
adjust a delay of the third clock signal to adjust the phase of the third clock signal based on the second skew correction signal; and
output the third clock signal to the selector circuit; and
a fourth delay buffer circuit configured to:
receive the fourth clock signal generated by the fourth differential to single-ended comparator;
receive the third skew correction signal;
adjust a delay of the fourth clock signal to adjust the phase of the fourth clock signal based on the third skew correction signal; and
output the fourth clock signal to the selector circuit;
to adjust by the correction circuit the respective clock duty cycle of the selected one of the clock signals based on the DCD correction signal, the correction circuit is configured to input the respective DCD correction signal to the corresponding one of the differential to single-ended comparator circuits to adjust a bias voltage of the differential to single-ended comparator circuit to adjust the respective clock duty cycle of the selected one of the clock signals; and
to adjust by the correction circuit the respective clock phase of the second one of the clock signals of the corresponding pair of clock signals that the selected one of the derived signals was generated based on, the correction circuit is configured to input the respective skew correction signal to the corresponding delay buffer circuit to adjust a delay of the second one of the clock signals of the corresponding pair of clock signals that the selected one of the derived signals was generated based on thereby adjusting the phase of the second one of the clocks signals.

20. The circuit of claim 19, wherein after adjusting all the respective clock duty cycles of all the clock signals until their respective clock duty cycles substantially match the predetermined clock duty cycle and after adjusting all the respective derived duty cycles of all the derived signals until their respective derived duty cycles substantially match the predetermined derived duty cycle:
the phase offset between the second clock signal and the first clock signal is a 90 degree phase offset such that the phase of the second clock signal is offset 90 degrees relative to the phase of the first clock signal;
the phase offset between the third clock signal and the second clock signal is a 90 degree phase offset such that the phase of the third clock signal is offset 90 degrees relative to the phase of the second clock signal such that the phase of the third clock signal is offset 180 degrees relative to the phase of the first clock signal;
the phase offset between the fourth clock signal and the third clock signal is a 90 degree phase offset such that the phase of the fourth clock signal is offset 90 degrees relative to the phase of the third clock signal such that the phase of the fourth clock signal is offset 270 degrees relative to the phase of the first clock signal.

21. A circuit comprising:
a correction circuit configured to:
receive two or more clock signals having a clock frequency, each of the clock signals having a respective clock phase;
generate one or more derived signals, each of the derived signals being generated based on a corresponding pair of the clock signals and having a respective duty cycle;
a selector circuit configured to sequentially select each one of the derived signals;
a detection circuit configured to generate a control signal based on the respective duty cycle of the selected one of the derived signals;
a feedback control circuit configured to generate a skew correction signal based on the control signal;
wherein:
the correction circuit is configured to, based on the skew correction signal, adjust the respective clock phase of a second one of the clock signals of the corresponding pair of clock signals that the selected one of the derived signals was generated based on; and
the detection circuit, the feedback control circuit, and the correction circuit are configured to adjust the control and skew correction signals and re-adjust the respective clock phase of the second one of the clock signals of the corresponding pair of clock signals that the selected one of the derived signals was generated based on until the respective duty cycle of the selected one of the derived signals substantially matches the predetermined duty cycle, the predetermined duty cycle being set to make a respective phase offset of the respective clock phase of the second one of the clock signals of the corresponding pair of clock signals that the selected one of the derived signals was generated based on substantially match a predetermined phase offset relative to the respective clock phase of a first one of the clock signals of the corresponding pair of clock signals that the selected one of the clock signals was generated based on.

22. The circuit of claim 21, wherein each one of the derived signals is an XOR signal that is the exclusive disjunction (XOR) of the first and second ones of the clock signals of the corresponding pair of clock signals that the respective one of the derived signals was generated based on.

\* \* \* \* \*